(12) United States Patent
Xu

(10) Patent No.: US 10,310,338 B2
(45) Date of Patent: Jun. 4, 2019

(54) MANUFACTURE METHOD OF IPS TFT-LCD ARRAY SUBSTRATE AND IPS TFT-LCD ARRAY SUBSTRATE

(71) Applicant: Shenzhen China Star Optoelectronics Technology Co., Ltd., Shenzhen (CN)

(72) Inventor: Xiangyang Xu, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 102 days.

(21) Appl. No.: 15/026,253

(22) PCT Filed: Feb. 25, 2016

(86) PCT No.: PCT/CN2016/074502
§ 371 (c)(1),
(2) Date: Mar. 31, 2016

(87) PCT Pub. No.: WO2017/121008
PCT Pub. Date: Jul. 20, 2017

(65) Prior Publication Data
US 2018/0059491 A1 Mar. 1, 2018

(30) Foreign Application Priority Data
Jan. 11, 2016 (CN) .......................... 2016 1 0015472

(51) Int. Cl.
*G02F 1/1343* (2006.01)
*H01L 21/77* (2017.01)
(Continued)

(52) U.S. Cl.
CPC ...... *G02F 1/134363* (2013.01); *G02F 1/1368* (2013.01); *G02F 1/13439* (2013.01);
(Continued)

(58) Field of Classification Search
CPC .......... H01L 21/0217; H01L 21/02271; H01L 21/02532; H01L 21/0262; H01L 21/0259
See application file for complete search history.

(56) References Cited

U.S. PATENT DOCUMENTS

2004/0263757 A1* 12/2004 Kwon ............... G02F 1/134363
349/149
2008/0171409 A1* 7/2008 Cheng .................... H01L 29/04
438/160

(Continued)

FOREIGN PATENT DOCUMENTS

| CN | 102723365 A | 10/2012 |
|---|---|---|
| CN | 104122713 A | 10/2014 |
| CN | 104330915 A | 2/2015 |

*Primary Examiner* — Phuc T Dang
(74) *Attorney, Agent, or Firm* — Leong C. Lei

(57) ABSTRACT

The present invention provides a manufacture method of an IPS TFT-LCD array substrate and an IPS TFT-LCD array substrate. In the manufacture method of the IPS TFT-LCD array substrate, the common electrode line and the gate are manufactured with the same metal layer, and the pixel electrode and the drain are manufactured with the same metal layer, and the via is formed in the insulation protective layer and the gate isolation layer correspondingly above the common electrode line; in the TFT array substrate, the pixel electrode and the drain are manufactured with the same metal layer, and the common electrode line and the gate are manufactured with the same metal layer, and the common electrode is transparent conductive material and located on the insulation protective layer, and the common electrode contact with the common electrode line through the via in the insulation protective layer and the gate isolation layer.

10 Claims, 4 Drawing Sheets

(51) Int. Cl.
    *H01L 27/12*     (2006.01)
    *G02F 1/1362*     (2006.01)
    *G02F 1/1368*     (2006.01)
    *H01L 21/02*     (2006.01)
    *H01L 21/027*     (2006.01)
    *H01L 21/285*     (2006.01)
    *H01L 21/306*     (2006.01)
    *H01L 21/308*     (2006.01)
    *H01L 21/311*     (2006.01)
    *H01L 21/3213*     (2006.01)
    *H01L 29/423*     (2006.01)
    *H01L 29/45*     (2006.01)
    *H01L 29/49*     (2006.01)
    *H01L 29/51*     (2006.01)
    *H01L 29/66*     (2006.01)
    *H01L 29/786*     (2006.01)

(52) U.S. Cl.
CPC .... *G02F 1/136286* (2013.01); *H01L 21/0217* (2013.01); *H01L 21/0262* (2013.01); *H01L 21/0274* (2013.01); *H01L 21/02271* (2013.01); *H01L 21/02532* (2013.01); *H01L 21/02592* (2013.01); *H01L 21/2855* (2013.01); *H01L 21/3086* (2013.01); *H01L 21/30604* (2013.01); *H01L 21/31111* (2013.01); *H01L 21/31144* (2013.01); *H01L 21/32134* (2013.01); *H01L 21/32139* (2013.01); *H01L 21/77* (2013.01); *H01L 27/12* (2013.01); *H01L 27/124* (2013.01); *H01L 27/127* (2013.01); *H01L 27/1222* (2013.01); *H01L 27/1248* (2013.01); *H01L 27/1262* (2013.01); *H01L 27/1288* (2013.01); *H01L 29/42364* (2013.01); *H01L 29/42384* (2013.01); *H01L 29/458* (2013.01); *H01L 29/4908* (2013.01); *H01L 29/518* (2013.01); *H01L 29/66765* (2013.01); *H01L 29/78669* (2013.01); *H01L 29/78696* (2013.01); *G02F 2001/134318* (2013.01); *G02F 2001/136295* (2013.01); *G02F 2201/121* (2013.01); *G02F 2201/122* (2013.01); *G02F 2201/123* (2013.01); *G02F 2202/103* (2013.01)

(56) References Cited

U.S. PATENT DOCUMENTS

| | | | |
|---|---|---|---|
| 2009/0032819 A1* | 2/2009 | Lim | G02F 1/13458 257/72 |
| 2009/0085077 A1* | 4/2009 | Wang | H01L 31/1055 257/292 |
| 2009/0091678 A1 | 4/2009 | Jeong et al. | |
| 2009/0261342 A1* | 10/2009 | Zhang | G02F 1/133512 257/72 |
| 2010/0032664 A1* | 2/2010 | Lee | H01L 27/1225 257/43 |
| 2010/0301311 A1* | 12/2010 | Oku | H01L 51/0529 257/40 |
| 2011/0305882 A1* | 12/2011 | Kim | H01L 27/1214 428/195.1 |
| 2014/0252328 A1* | 9/2014 | Takamatsu | H01L 51/524 257/40 |
| 2015/0325705 A1* | 11/2015 | Choi | G02F 1/134363 257/72 |
| 2015/0348999 A1* | 12/2015 | Guo | H01L 27/1288 438/151 |
| 2016/0097958 A1* | 4/2016 | Lee | G02F 1/136286 349/43 |
| 2016/0141531 A1* | 5/2016 | Fukushima | H01L 51/0545 257/40 |

\* cited by examiner

MANUFACTURE METHOD OF IPS TFT-LCD ARRAY SUBSTRATE AND IPS TFT-LCD ARRAY SUBSTRATE

FIELD OF THE INVENTION

The present invention relates to a display technology field, and more particularly to a manufacture method of an IPS TFT-LCD array substrate and an IPS TFT-LCD array substrate.

BACKGROUND OF THE INVENTION

With the development of display technology, the Thin Film Transistor Liquid Crystal Display (TFT-LCD), such as Liquid Crystal Display (LCD) possesses advantages of high image quality, power saving, thin body and wide application scope. Thus, it has been widely applied in various consumer electrical products, such as mobile phone, television, personal digital assistant, digital camera, notebook, laptop, and becomes the major display device.

Most of the liquid crystal displays on the present market are back light type liquid crystal displays, which comprise a liquid crystal display panel and a back light module. The working principle of the liquid crystal display panel is to locate liquid crystal molecules between two parallel glass substrates, and a plurality of vertical and horizontal tiny electrical wires are between the two glass substrates. The light of back light module is reflected to generate images by applying driving voltages to control whether the liquid crystal molecules to be changed directions. Generally, the liquid crystal display panel comprises a CF (Color Filter) substrate, an array substrate, LC (Liquid Crystal) sandwiched between the CF substrate and TFT substrate and sealant. The formation process generally comprises: a forepart Array process (thin film, photo, etching and stripping), a middle Cell process (Lamination of the array substrate and the CF substrate) and a post module assembly process (Attachment of the driving IC and the printed circuit board). The forepart Array process is mainly to form the array substrate for controlling the movement of the liquid crystal molecules; the middle Cell process is mainly to add liquid crystal between the array substrate and the CF substrate; the post module assembly process is mainly the driving IC attachment and the integration of the printed circuit board. Thus, the liquid crystal molecules are driven to rotate and display pictures. The TFT-LCD array substrate comprises a plurality of scan lines, a plurality of data lines and a plurality of common electrode lines. The plurality of scan lines and the plurality of data lines define a plurality of pixel units. Each pixel unit comprises a thin film transistor and a pixel electrode. The gate of the thin film transistor is coupled to the corresponding gate line. As the voltage of the gate line reaches the activation voltage, the source and the drain are conducted, and the data voltage of the data line is inputted to the pixel electrode.

For the TFT-LCD in the mainstream market, three types, which can be categorized according to the driving modes of the liquid crystal, respectively are Twisted Nematic (TN), Super Twisted Nematic (STN), In-Plane Switching (IPS) and Vertical Alignment (VA). The IPS mode utilizes the electric field which is roughly parallel with the substrate surface to drive the liquid crystal molecules twisting along the substrate surface for response, and thus possesses excellent view angle property. Therefore, it is applied in kinds of TV display applications.

The structure of the IPS TFT-LCD array substrate is shown in FIG. 1. Each pixel unit comprises a gate 101 located on the substrate 100, a gate isolation layer 102 located on the gate 101 and the substrate 100, a semiconductor layer 103 located on the gate isolation layer 102, a source 104, a drain 105 located on the semiconductor layer 103 and the gate isolation layer 102, an insulation protective layer 106 located on the source 104, the drain 105, the semiconductor layer 103 and the gate isolation layer 102, and a pixel electrode 107 located on the insulation protective layer 106; moreover, in the array substrate, the common electrode layer 120, the gate 101 and the gate scan lines 110 are manufactured with the same metal layer, and the pixel electrode 107 is coupled to the drain 105 through the via structure in the insulation protective layer 106, because the resistance between the pixel electrode 107 and the drain 105 will influence the charge efficiency of the pixel electrode 107, the pixel electrode 107 cannot be charged to the ideal voltage in the scan duration of this row if the resistance is over large, and the display effect is affected. The factors of influencing the via contact resistance are many, such as the interface electron barrier height, the via size and the via overlap.

SUMMARY OF THE INVENTION

An objective of the present invention is to provide a manufacture method of an IPS TFT-LCD array substrate, in which the pixel electrode and the drain are manufactured with the same metal layer, and the common electrode utilizes the transparent conductive material and is connected with the common electrode line through the via to promote the charge efficiency of the pixel electrode.

Another objective of the present invention is to provide an IPS TFT-LCD array substrate, in which the pixel electrode and the drain belong to the same metal layer, and the common electrode utilizes the transparent conductive material and is connected with the common electrode line through the via, and the charge efficiency of the pixel electrode is high.

For realizing the aforesaid objective, the present invention provides a manufacture method of an IPS TFT-LCD array substrate, comprising steps of:

step 1, providing a substrate, and depositing a gate metal layer on the substrate, and patterning the gate metal layer to obtain a gate, a common electrode line and a gate scan line;

step 2, depositing a gate isolation layer on the gate metal layer, and depositing an amorphous silicon layer on the gate isolation layer, and patterning the amorphous silicon layer after performing N-type doping to the amorphous silicon layer to obtain a semiconductor layer correspondingly above the gate;

step 3, depositing a source-drain metal layer on the semiconductor layer and the gate isolation layer, and patterning the source-drain metal layer to obtain a source, a drain, a pixel electrode and a data line, and the source and the drain respectively contact with two ends of the semiconductor layer;

step 4, depositing an insulation protective layer on the source-drain metal layer, and patterning the insulation protective layer and the gate isolation layer to form a via correspondingly above the common electrode line in the insulation protective layer and the gate isolation layer;

step 5, depositing a transparent conductive layer on the insulation protective layer, and patterning the transparent conductive layer to obtain a common electrode, and the common electrode contacts with the common electrode line through the via.

The gate metal layer is deposited by physical vapor deposition in the step 1, and a film thickness of the deposited gate metal layer is 3000-6000 Å, and material of the gate metal layer is a stack combination of one or more of molybdenum, titanium, aluminum and copper; the step of patterning the gate metal layer comprises photoresist coating, exposure, development, wet etching and photoresist stripping in order.

The gate isolation layer and the amorphous silicon layer are deposited by chemical vapor deposition in the step 2, and a film thickness of the deposited gate isolation layer is 2000-5000 Å, and a film thickness of the deposited amorphous silicon layer is 1500-3000 Å, and the gate isolation layer is a silicon nitride layer, and the step of patterning the amorphous silicon layer comprises photoresist coating, exposure, development, wet etching and photoresist stripping in order.

The source-drain metal layer is deposited by physical vapor deposition in the step 3, and a film thickness of the deposited gate metal layer is 3000-6000 Å, and material of the source-drain metal layer is a stack combination of one or more of molybdenum, titanium, aluminum and copper; the step of patterning the source-drain metal layer comprises photoresist coating, exposure, development, wet etching and photoresist stripping in order.

The insulation protective layer is deposited by chemical vapor deposition in the step 4, and a film thickness of the deposited insulation protective layer is 2000-5000 Å, and the insulation protective layer is a silicon nitride layer, and the step of patterning the insulation protective layer comprises photoresist coating, exposure, development, wet etching and photoresist stripping in order.

The transparent conductive layer is deposited by physical vapor deposition in the step 5, and a film thickness of the deposited transparent conductive layer is 400-1000 Å, and material of the transparent conductive layer is one or more of Indium Tin Oxide, Aluminum Tin Oxide, Aluminum Zinc Oxide, Indium Germanium Zinc Oxide; the step of patterning the transparent conductive layer comprises photoresist coating, exposure, development, wet etching and photoresist stripping in order.

The present invention further provides an IPS TFT-LCD array substrate, comprising a substrate, a plurality of gate scan lines, a plurality of data lines, a plurality of common electrode lines and a plurality of pixel units, divided by the plurality of gate scan lines and the plurality of data lines which are mutually insulated and staggered, and aligned in array;

each pixel unit comprises: a gate formed on the substrate, a gate isolation layer formed on the gate and the substrate, a semiconductor layer correspondingly above the gate and formed on the gate isolation layer, a source, a drain and a pixel electrode formed on the semiconductor layer and the gate isolation layer, an insulation protective layer formed on the source, the drain, the pixel electrode, the semiconductor layer and the gate isolation layer, and a common electrode formed on the insulation protective layer;

the pixel electrode, the source, the drain and the data lines are obtained after patterning a source-drain metal layer, and the common electrode lines, the gate and the gate scan lines are obtained after patterning a gate metal layer;

a via is provided in the insulation protective layer and the gate isolation layer correspondingly above the common electrode line, and the common electrode contacts with the common electrode line through the via;

the source and the drain respectively contact with two ends of the semiconductor layer.

Material of the common electrode is transparent conductive material, and material of the transparent conductive material is one or more of Indium Tin Oxide, Aluminum Tin Oxide, Aluminum Zinc Oxide, Indium Germanium Zinc Oxide; a film thickness of the common electrode is 400-1000 Å.

Material of the source-drain metal layer is a stack combination of one or more of molybdenum, titanium, aluminum and copper, and a film thickness of the source-drain metal layer is 3000-6000 Å.

The present invention further provides a manufacture method of an IPS TFT-LCD array substrate, comprising steps of:

step 1, providing a substrate, and depositing a gate metal layer on the substrate, and patterning the gate metal layer to obtain a gate, a common electrode line and a gate scan line;

step 2, depositing a gate isolation layer on the gate metal layer, and depositing an amorphous silicon layer on the gate isolation layer, and patterning the amorphous silicon layer after performing N-type doping to the amorphous silicon layer to obtain a semiconductor layer correspondingly above the gate;

step 3, depositing a source-drain metal layer on the semiconductor layer and the gate isolation layer, and patterning the source-drain metal layer to obtain a source, a drain, a pixel electrode and a data line, and the source and the drain respectively contact with two ends of the semiconductor layer;

step 4, depositing an insulation protective layer on the source-drain metal layer, and patterning the insulation protective layer and the gate isolation layer to form a via correspondingly above the common electrode line in the insulation protective layer and the gate isolation layer;

step 5, depositing a transparent conductive layer on the insulation protective layer, and patterning the transparent conductive layer to obtain a common electrode, and the common electrode contacts with the common electrode line through the via;

wherein the gate metal layer is deposited by physical vapor deposition in the step 1, and a film thickness of the deposited gate metal layer is 3000-6000 Å, and material of the gate metal layer is a stack combination of one or more of molybdenum, titanium, aluminum and copper; the step of patterning the gate metal layer comprises photoresist coating, exposure, development, wet etching and photoresist stripping in order;

wherein the gate isolation layer and the amorphous silicon layer are deposited by chemical vapor deposition in the step 2, and a film thickness of the deposited gate isolation layer is 2000-5000 Å, and a film thickness of the deposited amorphous silicon layer is 1500-3000 Å, and the gate isolation layer is a silicon nitride layer, and the step of patterning the amorphous silicon layer comprises photoresist coating, exposure, development, wet etching and photoresist stripping in order;

wherein the source-drain metal layer is deposited by physical vapor deposition in the step 3, and a film thickness of the deposited gate metal layer is 3000-6000 Å, and material of the source-drain metal layer is a stack combination of one or more of molybdenum, titanium, aluminum and copper; the step of patterning the source-drain metal layer comprises photoresist coating, exposure, development, wet etching and photoresist stripping in order;

wherein the insulation protective layer is deposited by chemical vapor deposition in the step 4, and a film thickness of the deposited insulation protective layer is 2000-5000 Å, and the insulation protective layer is a silicon nitride layer, and the step of patterning the insulation protective layer comprises photoresist coating, exposure, development, wet etching and photoresist stripping in order;

wherein the transparent conductive layer is deposited by physical vapor deposition in the step 5, and a film thickness of the deposited transparent conductive layer is 400-1000 Å, and material of the transparent conductive layer is one or more of Indium Tin Oxide, Aluminum Tin Oxide, Aluminum Zinc Oxide, Indium Germanium Zinc Oxide; the step of patterning the transparent conductive layer comprises photoresist coating, exposure, development, wet etching and photoresist stripping in order.

The benefits of the present invention are: in the manufacture method of the IPS TFT-LCD array substrate according to the present invention, the common electrode line and the gate are manufactured with the same metal layer, and the pixel electrode and the drain are manufactured with the same metal layer, and the via is formed in the insulation protective layer and the gate isolation layer correspondingly above the common electrode line, and thus the charge efficiency of the pixel electrode can be promoted; in the IPS TFT-LCD array substrate according to the present invention, the pixel electrode and the drain are manufactured with the same metal layer, and the common electrode line and the gate are manufactured with the same metal layer, and the common electrode is transparent conductive material and located on the insulation protective layer, and the common electrode contact with the common electrode line through the via in the insulation protective layer and the gate isolation layer, thus, the charge efficiency of the pixel electrode is high and capable of promoting the display effect of the IPS TFT-LCD panel.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
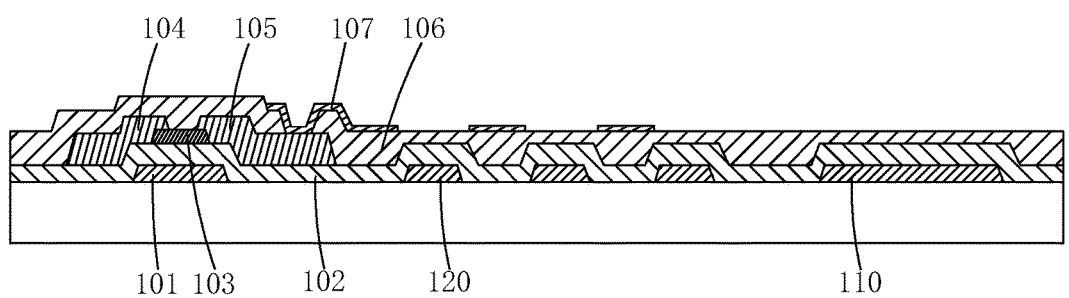
FIG. 1 is a structure diagram of an IPS TFT-LCD array substrate according to prior art.
Figure 2:
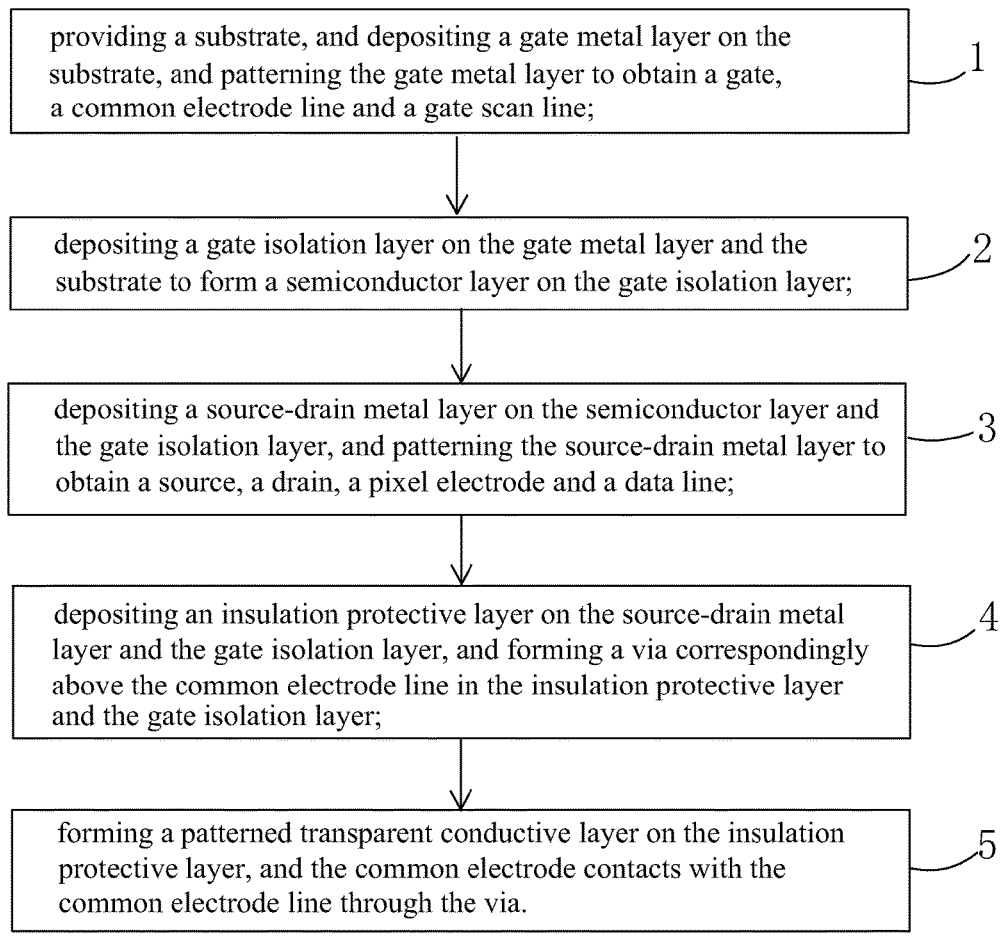
FIG. 2 is a flowchart of a manufacture method of an IPS TFT-LCD array substrate according to the present invention.
Figure 3:
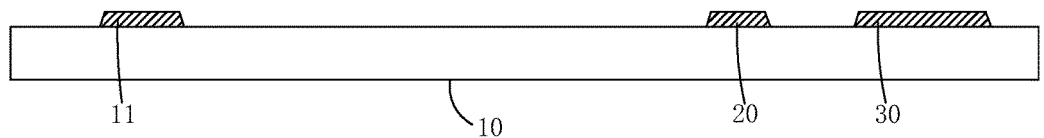
FIG. 3 is a diagram of the step 1 of the manufacture method of the IPS TFT-LCD array substrate according to the present invention.
Figure 4:
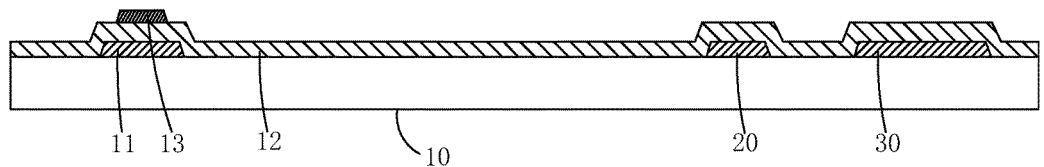
FIG. 4 is a diagram of the step 2 of the manufacture method of the IPS TFT-LCD array substrate according to the present invention.
Figure 5:
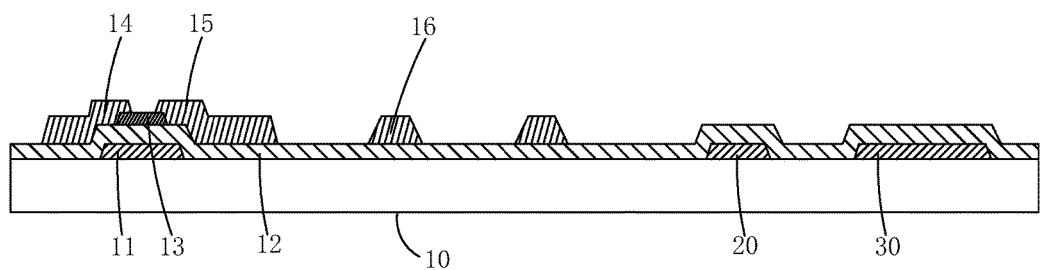
FIG. 5 is a diagram of the step 3 of the manufacture method of the IPS TFT-LCD array substrate according to the present invention.
Figure 6:
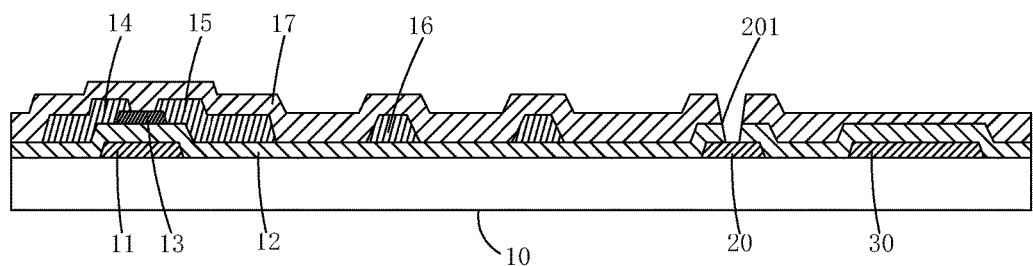
FIG. 6 is a diagram of the step 4 of the manufacture method of the IPS TFT-LCD array substrate according to the present invention.
Figure 7:
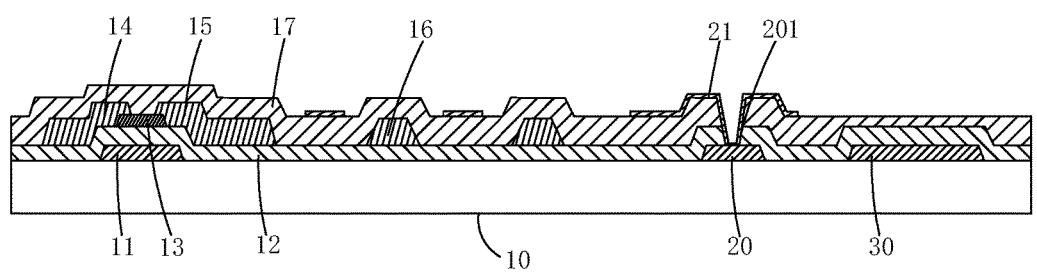
FIG. 7 is a diagram of the step 5 of the manufacture method of the IPS TFT-LCD array substrate according to the present invention and also a structure diagram of the IPS TFT-LCD array substrate according to the present invention.

Please refer to FIG. 2, the present invention provides a manufacture method of an IPS TFT-LCD array substrate, comprising steps of:

step 1, as shown in FIG. 3, providing a substrate 10, and depositing a gate metal layer on the substrate 10, and patterning the gate metal layer to obtain a gate 11, a common electrode line 20 and a gate scan line 30;

specifically, the gate metal layer is deposited by physical vapor deposition (PVD) in the step 1, and a film thickness of the deposited gate metal layer is 3000-6000 Å, and material of the gate metal layer is a stack combination of one or more of molybdenum, titanium, aluminum and copper; the step of patterning the gate metal layer comprises photoresist coating, exposure, development, wet etching and photoresist stripping in order.

step 2, as shown in FIG. 4, depositing a gate isolation layer 12 on the gate metal layer, and depositing an amorphous silicon layer on the gate isolation layer 12, and patterning the amorphous silicon layer after performing N-type doping to the amorphous silicon layer to obtain a semiconductor layer 13 above the gate 11;

specifically, the gate isolation layer 12 and the amorphous silicon layer are deposited by chemical vapor deposition (CVD) in the step 2, and a film thickness of the deposited gate isolation layer 12 is 2000-5000 Å, and a film thickness of the deposited amorphous silicon layer is 1500-3000 Å, and the gate isolation layer is a silicon nitride layer, and the step of patterning the amorphous silicon layer comprises photoresist coating, exposure, development, wet etching and photoresist stripping in order;

preferably, the gate isolation layer 12 is a silicon nitride layer.

step 3, as shown in FIG. 5, depositing a source-drain metal layer on the semiconductor layer 13 and the gate isolation layer 12, and patterning the source-drain metal layer to obtain a source 14, a drain 15, a pixel electrode 16 and a data line, and the source 14 and the drain 15 respectively contact with two ends of the semiconductor layer 13;

specifically, the source-drain metal layer is deposited by physical vapor deposition in the step 3, and a film thickness of the deposited gate metal layer is 3000-6000 Å, and material of the source-drain metal layer is a stack combination of one or more of molybdenum, titanium, aluminum and copper; the step of patterning the source-drain metal layer comprises photoresist coating, exposure, development, wet etching and photoresist stripping in order.

step 4, as shown in FIG. 6, depositing an insulation protective layer 17 on the source-drain metal layer, and patterning the insulation protective layer 17 and the gate isolation layer 12 to form a via 201 correspondingly above the common electrode line 20 in the insulation protective layer 17 and the gate isolation layer 12;

specifically, the insulation protective layer 17 is deposited by chemical vapor deposition in the step 4, and a film thickness of the deposited insulation protective layer 17 is 2000-5000 Å, and the step of patterning the insulation protective layer 17 and the gate isolation layer 12 comprises photoresist coating, exposure, development, wet etching and photoresist stripping in order;

preferably, the insulation protective layer 17 is a silicon nitride layer.

step 5, as shown in FIG. 7, depositing a transparent conductive layer on the insulation protective layer 17, and patterning the transparent conductive layer to obtain a common electrode 21, and the common electrode 21 contacts with the common electrode line 20 through the via 201.

Specifically, the transparent conductive layer is deposited by physical vapor deposition in the step 5, and a film thickness of the deposited transparent conductive layer is 400-1000 Å, and material of the transparent conductive layer is one or more of Indium Tin Oxide, Aluminum Tin Oxide, Aluminum Zinc Oxide, Indium Germanium Zinc Oxide;

preferably, material of the deposited transparent conductive layer is Indium Tin Oxide (ITO);

specifically, the step of patterning the transparent conductive layer comprises photoresist coating, exposure, development, wet etching and photoresist stripping in order.

Please refer to FIG. 7. On the basis of the aforesaid manufacture method of the IPS TFT-LCD array substrate, the present invention further provides an IPS TFT-LCD array substrate, comprising a substrate 10, a plurality of gate scan lines 30 located on the substrate 10, a plurality of data lines (not shown), a plurality of common electrode lines 20 and a plurality of pixel units, divided by the plurality of gate scan lines and the plurality of data lines which are mutually insulated and staggered, and aligned in array;

each pixel unit comprises: a gate 11 formed on the substrate 10, a gate isolation layer 12 formed on the gate 11 and the substrate 10, a semiconductor layer 13 correspondingly above the gate 11 and formed on the gate isolation layer 12, a source 14, a drain 15 and a pixel electrode 16 formed on the semiconductor layer 13 and the gate isolation layer 12, an insulation protective layer 17 formed on the source 14, the drain 15, the pixel electrode 16, the semiconductor layer 13 and the gate isolation layer 12, and a common electrode 21 formed on the insulation protective layer 17;

the pixel electrode 16, the source 14, the drain 15 and the data lines are obtained after patterning a source-drain metal layer, and the common electrode lines 20, the gate 11 and the gate scan lines 30 are obtained after patterning a gate metal layer;

a via 201 is provided in the insulation protective layer 17 and the gate isolation layer 12 correspondingly above the common electrode line 20, and the common electrode 21 contacts with the common electrode line 20 through the via 201;

the source 14 and the drain 15 respectively contact with two ends of the semiconductor layer 13.

Specifically, material of the common electrode 21 is transparent conductive material, and material of the transparent conductive material is one or more of Indium Tin Oxide, Aluminum Tin Oxide, Aluminum Zinc Oxide, Indium Germanium Zinc Oxide; a film thickness of the common electrode 21 is 400-1000 Å;

Preferably, material of the common electrode 21 is Indium Tin Oxide.

Specifically, material of the source-drain metal layer is a stack combination of one or more of molybdenum, titanium, aluminum and copper, and a film thickness of the source-drain metal layer is 3000-6000 Å.

In conclusion, in the manufacture method of the IPS TFT-LCD array substrate according to the present invention, the common electrode line and the gate are manufactured with the same metal layer, and the pixel electrode and the drain are manufactured with the same metal layer, and the via is formed in the insulation protective layer and the gate isolation layer correspondingly above the common electrode line, and thus the charge efficiency of the pixel electrode can be promoted; in the IPS TFT-LCD array substrate according to the present invention, the pixel electrode and the drain are manufactured with the same metal layer, and the common electrode line and the gate are manufactured with the same metal layer, and the common electrode is transparent conductive material and located on the insulation protective layer, and the common electrode contact with the common electrode line through the via in the insulation protective layer and the gate isolation layer, thus, the charge efficiency of the pixel electrode is high and capable of promoting the display effect of the IPS TFT-LCD panel.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of an in-plane switching thin film transistor liquid crystal display (IPS TFT-LCD) array substrate, comprising steps of:

step 1, providing a substrate, and depositing a gate metal layer on the substrate, and patterning the gate metal layer to obtain a gate, a common electrode line and a gate scan line;

step 2, depositing a gate isolation layer on the gate metal layer, and depositing an amorphous silicon layer on the gate isolation layer, and patterning the amorphous silicon layer after performing N-type doping to the amorphous silicon layer to obtain a semiconductor layer correspondingly above the gate;

step 3, depositing a source-drain metal layer on the semiconductor layer and the gate isolation layer, and patterning the source-drain metal layer to obtain a source, a drain, a pixel electrode and a data line, and the source and the drain respectively contact with two ends of the semiconductor layer;

step 4, depositing an insulation protective layer on the source-drain metal layer, and patterning the insulation protective layer and the gate isolation layer to form a via correspondingly above the common electrode line in the insulation protective layer and the gate isolation layer;

step 5, depositing a transparent conductive layer on the insulation protective layer, and patterning the transparent conductive layer to obtain a common electrode, and the common electrode contacts with the common electrode line through the via;

wherein forming the pixel electrode is carried out posterior to forming the common electrode such that the common electrode is located above and isolated from the pixel electrode, the common electrode being spaced from the substrate by a distance greater than a distance by which the pixel electrode is spaced from the substrate.

2. The manufacture method of the IPS TFT-LCD array substrate according to claim 1, wherein the gate metal layer is deposited by physical vapor deposition in the step 1, and a film thickness of the deposited gate metal layer is 3000-6000 Å, and material of the gate metal layer is a stack combination of one or more of molybdenum, titanium, aluminum and copper; the step of patterning the gate metal layer comprises photoresist coating, exposure, development, wet etching and photoresist stripping in order.

3. The manufacture method of the IPS TFT-LCD array substrate according to claim 1, wherein the gate isolation layer and the amorphous silicon layer are deposited by chemical vapor deposition in the step 2, and a film thickness of the deposited gate isolation layer is 2000-5000 Å, and a film thickness of the deposited amorphous silicon layer is 1500-3000 Å, and the gate isolation layer is a silicon nitride layer, and the step of patterning the amorphous silicon layer comprises photoresist coating, exposure, development, wet etching and photoresist stripping in order.

4. The manufacture method of the IPS TFT-LCD array substrate according to claim 1, wherein the source-drain metal layer is deposited by physical vapor deposition in the step 3, and a film thickness of the deposited gate metal layer is 3000-6000 Å, and material of the source-drain metal layer is a stack combination of one or more of molybdenum, titanium, aluminum and copper; the step of patterning the source-drain metal layer comprises photoresist coating, exposure, development, wet etching and photoresist stripping in order.

5. The manufacture method of the IPS TFT-LCD array substrate according to claim 1, wherein the insulation protective layer is deposited by chemical vapor deposition in the step 4, and a film thickness of the deposited insulation protective layer is 2000-5000 Å, and the insulation protective layer is a silicon nitride layer, and the step of patterning the insulation protective layer comprises photoresist coating, exposure, development, wet etching and photoresist stripping in order.

6. The manufacture method of the IPS TFT-LCD array substrate according to claim 1, wherein the transparent conductive layer is deposited by physical vapor deposition in the step 5, and a film thickness of the deposited transparent conductive layer is 400-1000 Å, and material of the transparent conductive layer is one or more of Indium Tin Oxide, Aluminum Tin Oxide, Aluminum Zinc Oxide, Indium Germanium Zinc Oxide; the step of patterning the transparent conductive layer comprises photoresist coating, exposure, development, wet etching and photoresist stripping in order.

7. An in-plane switching thin film transistor liquid crystal display (IPS TFT-LCD) array substrate, comprising a substrate, a plurality of gate scan lines, a plurality of data lines, a plurality of common electrode lines and a plurality of pixel units, divided by the plurality of gate scan lines and the plurality of data lines which are mutually insulated and staggered, and aligned in an array;
wherein each pixel unit comprises: a gate formed on the substrate, a gate isolation layer formed on the gate and the substrate, a semiconductor layer correspondingly above the gate and formed on the gate isolation layer, a source, a drain and a pixel electrode formed on the semiconductor layer and the gate isolation layer, an insulation protective layer formed on the source, the drain, the pixel electrode, the semiconductor layer and the gate isolation layer, and a common electrode formed on the insulation protective layer;
the pixel electrode, the source, the drain and the data lines are obtained after patterning a source-drain metal layer, and the common electrode lines, the gate and the gate scan lines are obtained after patterning a gate metal layer;
a via is provided in the insulation protective layer and the gate isolation layer correspondingly above the common electrode line, and the common electrode contacts with the common electrode line through the via;
the source and the drain respectively contact with two ends of the semiconductor layer;
wherein the common electrode is located above and isolated from the pixel electrode, the common electrode being spaced from the substrate by a distance greater than a distance by which the pixel electrode is spaced from the substrate.

8. The IPS TFT-LCD array substrate according to claim 7, wherein material of the common electrode is transparent conductive material, and material of the transparent conductive material is one or more of Indium Tin Oxide, Aluminum Tin Oxide, Aluminum Zinc Oxide, Indium Germanium Zinc Oxide; a film thickness of the common electrode is 400-1000 Å.

9. The IPS TFT-LCD array substrate according to claim 7, wherein material of the source-drain metal layer is a stack combination of one or more of molybdenum, titanium, aluminum and copper, and a film thickness of the source-drain metal layer is 3000-6000 Å.

10. A manufacture method of an in-plane switching thin film transistor liquid crystal display (IPS TFT-LCD) array substrate, comprising steps of:
step 1, providing a substrate, and depositing a gate metal layer on the substrate, and patterning the gate metal layer to obtain a gate, a common electrode line and a gate scan line;
step 2, depositing a gate isolation layer on the gate metal layer, and depositing an amorphous silicon layer on the gate isolation layer, and patterning the amorphous silicon layer after performing N-type doping to the amorphous silicon layer to obtain a semiconductor layer correspondingly above the gate;
step 3, depositing a source-drain metal layer on the semiconductor layer and the gate isolation layer, and patterning the source-drain metal layer to obtain a source, a drain, a pixel electrode and a data line, and the source and the drain respectively contact with two ends of the semiconductor layer;
step 4, depositing an insulation protective layer on the source-drain metal layer, and patterning the insulation protective layer and the gate isolation layer to form a via correspondingly above the common electrode line in the insulation protective layer and the gate isolation layer;
step 5, depositing a transparent conductive layer on the insulation protective layer, and patterning the transparent conductive layer to obtain a common electrode, and the common electrode contacts with the common electrode line through the via;
wherein forming the pixel electrode is carried out posterior to forming the common electrode such that the common electrode is located above and isolated from the pixel electrode, the common electrode being spaced from the substrate by a distance greater than a distance by which the pixel electrode is spaced from the substrate;
wherein the gate metal layer is deposited by physical vapor deposition in the step 1, and a film thickness of the deposited gate metal layer is 3000-6000 Å, and material of the gate metal layer is a stack combination of one or more of molybdenum, titanium, aluminum and copper; the step of patterning the gate metal layer comprises photoresist coating, exposure, development, wet etching and photoresist stripping in order;

wherein the gate isolation layer and the amorphous silicon layer are deposited by chemical vapor deposition in the step 2, and a film thickness of the deposited gate isolation layer is 2000-5000 Å, and a film thickness of the deposited amorphous silicon layer is 1500-3000 Å, and the gate isolation layer is a silicon nitride layer, and the step of patterning the amorphous silicon layer comprises photoresist coating, exposure, development, wet etching and photoresist stripping in order;

wherein the source-drain metal layer is deposited by physical vapor deposition in the step 3, and a film thickness of the deposited gate metal layer is 3000-6000 Å, and material of the source-drain metal layer is a stack combination of one or more of molybdenum, titanium, aluminum and copper; the step of patterning the source-drain metal layer comprises photoresist coating, exposure, development, wet etching and photoresist stripping in order;

wherein the insulation protective layer is deposited by chemical vapor deposition in the step 4, and a film thickness of the deposited insulation protective layer is 2000-5000 Å, and the insulation protective layer is a silicon nitride layer, and the step of patterning the insulation protective layer comprises photoresist coating, exposure, development, wet etching and photoresist stripping in order;

wherein the transparent conductive layer is deposited by physical vapor deposition in the step 5, and a film thickness of the deposited transparent conductive layer is 400-1000 Å, and material of the transparent conductive layer is one or more of Indium Tin Oxide, Aluminum Tin Oxide, Aluminum Zinc Oxide, Indium Germanium Zinc Oxide; the step of patterning the transparent conductive layer comprises photoresist coating, exposure, development, wet etching and photoresist stripping in order.

\* \* \* \* \*